US008362585B1

(12) United States Patent
Bhalla et al.

(10) Patent No.: US 8,362,585 B1
(45) Date of Patent: Jan. 29, 2013

(54) JUNCTION BARRIER SCHOTTKY DIODE WITH ENFORCED UPPER CONTACT STRUCTURE AND METHOD FOR ROBUST PACKAGING

(75) Inventors: Anup Bhalla, Santa Clara, CA (US); Ji Pan, San Jose, CA (US); Daniel Ng, Campbell, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/184,488

(22) Filed: Jul. 15, 2011

(51) Int. Cl.
  H01L 29/66 (2006.01)
  H01L 29/40 (2006.01)
  H01L 21/02 (2006.01)

(52) U.S. Cl. ........ 257/476; 257/483; 257/484; 257/485; 257/486; 257/495; 257/E29.013; 257/E29.338

(58) Field of Classification Search .................. 257/476, 257/483, 484, 486, 495, E29.013, E29.338; 438/534, 571
See application file for complete search history.

(56) References Cited

U.S. PATENT DOCUMENTS

| | | | |
|---|---|---|---|
| 4,134,123 A | 1/1979 | Shannon | |
| 4,754,310 A | 6/1988 | Coe | |
| 5,693,569 A | 12/1997 | Ueno | |
| 5,703,408 A | 12/1997 | Ming-Tsung et al. | |
| 5,834,365 A | 11/1998 | Ming-Tsung et al. | |
| 6,426,541 B2 | 7/2002 | Chang et al. | |
| 6,465,337 B1 | 10/2002 | Lee et al. | |
| 6,710,403 B2 | 3/2004 | Sapp | |
| 6,784,505 B2 | 8/2004 | Zeng | |
| 6,825,105 B2 | 11/2004 | Grover et al. | |
| 6,977,208 B2 | 12/2005 | Chiola | |
| 6,998,678 B2 | 2/2006 | Werner et al. | |
| 6,998,694 B2 | 2/2006 | Wu et al. | |
| 7,279,390 B2 * | 10/2007 | Duskin et al. | 438/328 |
| 7,615,839 B2 * | 11/2009 | Souma et al. | 257/473 |
| 7,863,682 B2 * | 1/2011 | Okuno et al. | 257/339 |
| 2003/0052383 A1 | 3/2003 | Nemoto et al. | |
| 2003/0155628 A1 | 8/2003 | Zeng et al. | |
| 2004/0046224 A1 | 3/2004 | Rossel et al. | |
| 2004/0211974 A1 * | 10/2004 | Wu | 257/107 |
| 2004/0222457 A1 | 11/2004 | Kim et al. | |
| 2005/0029585 A1 | 2/2005 | He et al. | |
| 2005/0029614 A1 | 2/2005 | Wu et al. | |
| 2005/0167742 A1 | 8/2005 | Challa et al. | |
| 2005/0194610 A1 * | 9/2005 | Souma et al. | 257/133 |
| 2005/0230744 A1 | 10/2005 | Wu | |
| 2006/0138450 A1 | 6/2006 | Lanois et al. | |
| 2008/0217625 A1 * | 9/2008 | Kuroda et al. | 257/76 |
| 2008/0277668 A1 * | 11/2008 | Okuno et al. | 257/77 |

* cited by examiner

Primary Examiner — Ngan Ngo
(74) Attorney, Agent, or Firm — Chein-Hwa Tsao; CH Emily LLC

(57) ABSTRACT

A semiconductor junction barrier Schottky (JBS-SKY) diode with enforced upper contact structure (EUCS) is disclosed. Referencing an X-Y-Z coordinate, the JBS-SKY diode has semiconductor substrate (SCST) parallel to X-Y plane. Active device zone (ACDZ) atop SCST and having a JBS-SKY diode with Z-direction current flow. Peripheral guarding zone (PRGZ) atop SCST and surrounding the ACDZ. The ACDZ has active lower semiconductor structure (ALSS) and enforced active upper contact structure (EUCS) atop ALSS. The EUC has top contact metal (TPCM) extending downwards and in electrical conduction with bottom of EUCS; and embedded bottom supporting structure (EBSS) inside TPCM and made of a hard material, the EBSS extending downwards till bottom of the EUCS. Upon encountering bonding force onto TPCM during packaging of the JBS-SKY diode, the EBSS enforces the EUCS against an otherwise potential micro cracking of the TPCM degrading the leakage current of the JBS-SKY diode.

23 Claims, 12 Drawing Sheets

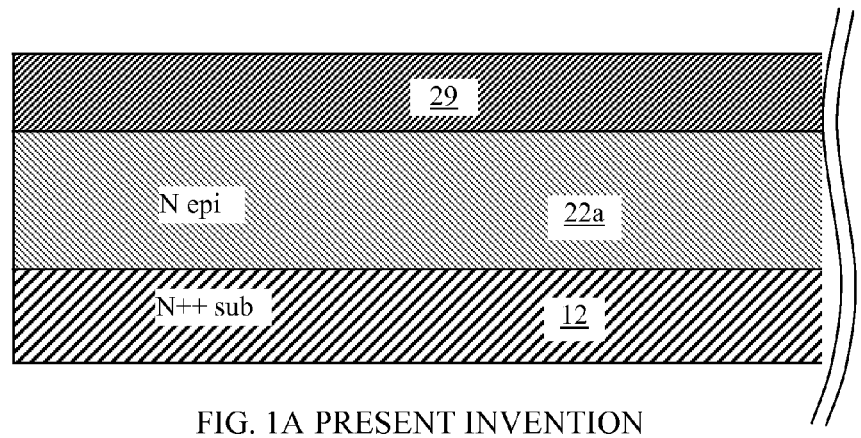
FIG. 1A PRESENT INVENTION
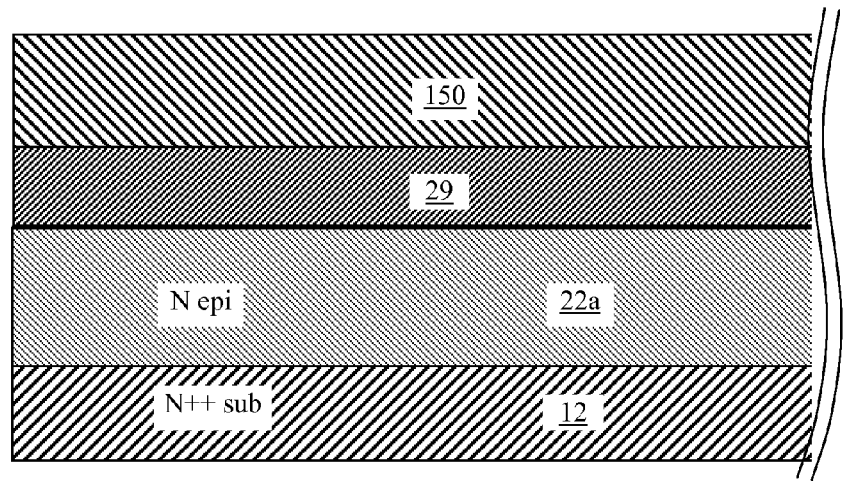
FIG. 1B PRESENT INVENTION

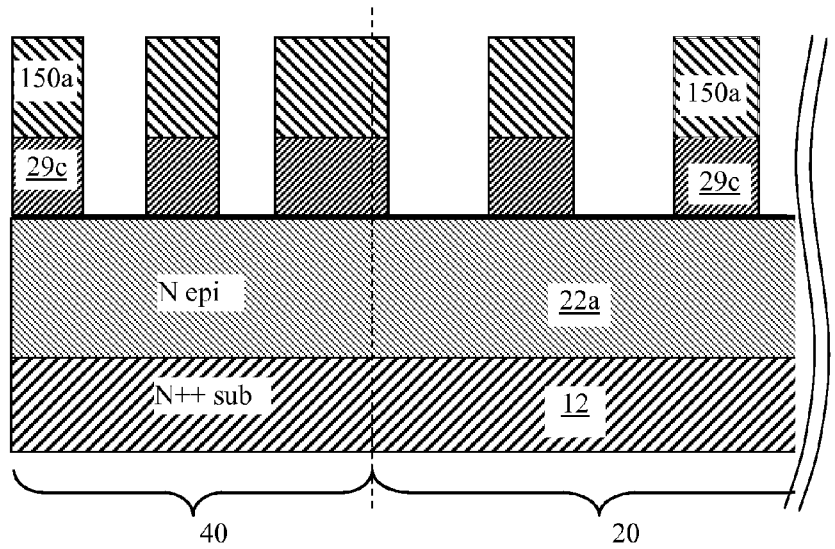
FIG. 1C PRESENT INVENTION
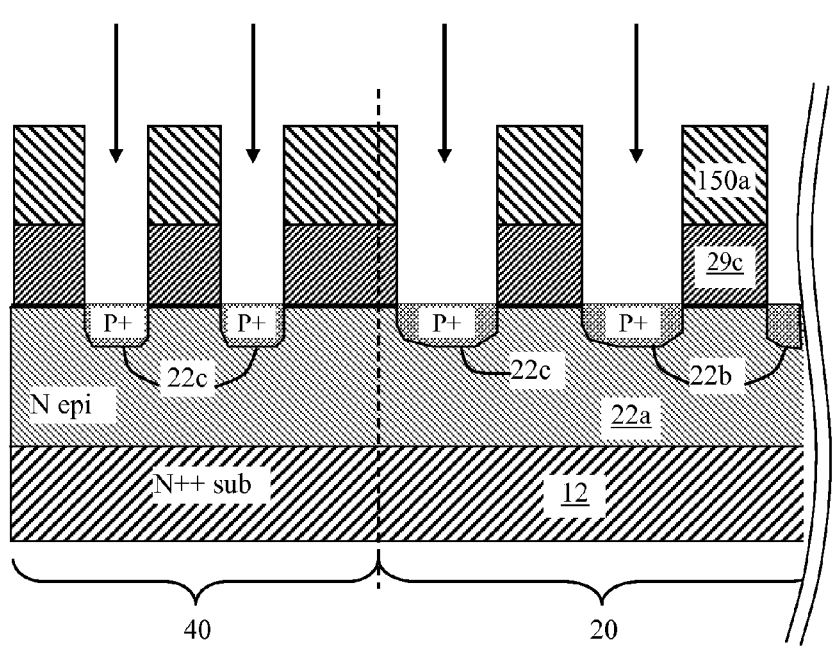
FIG. 1D PRESENT INVENTION

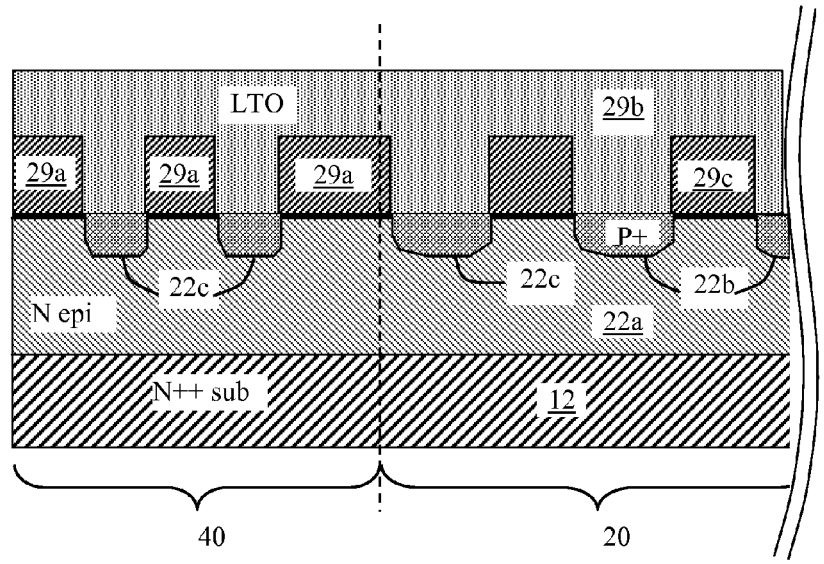
FIG. 1E PRESENT INVENTION
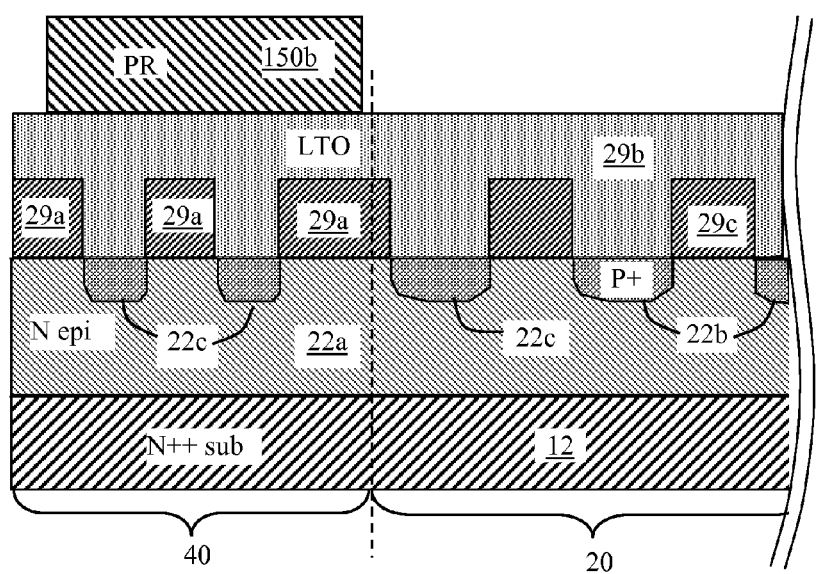
FIG. 1F PRESENT INVENTION

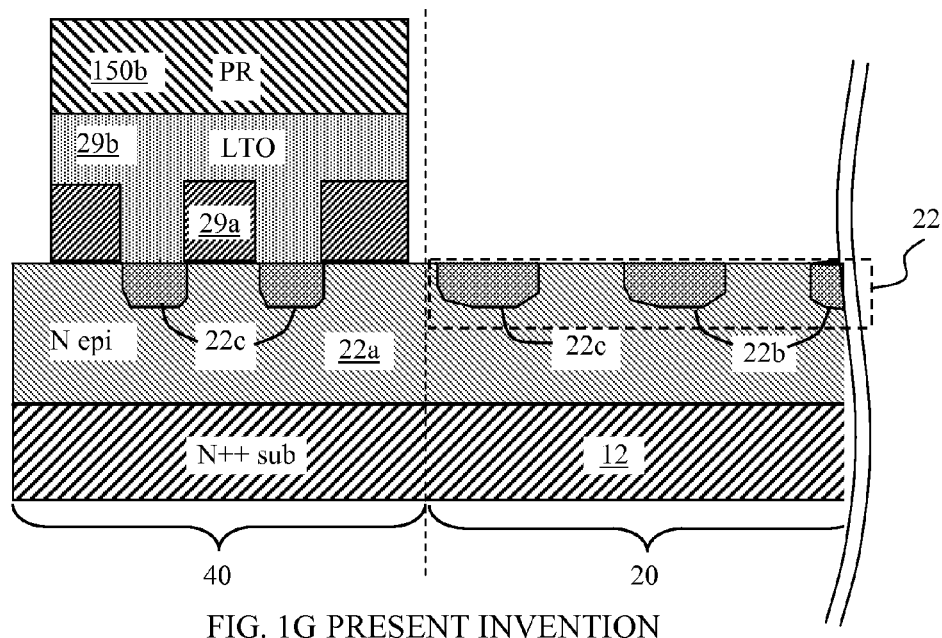
FIG. 1G PRESENT INVENTION
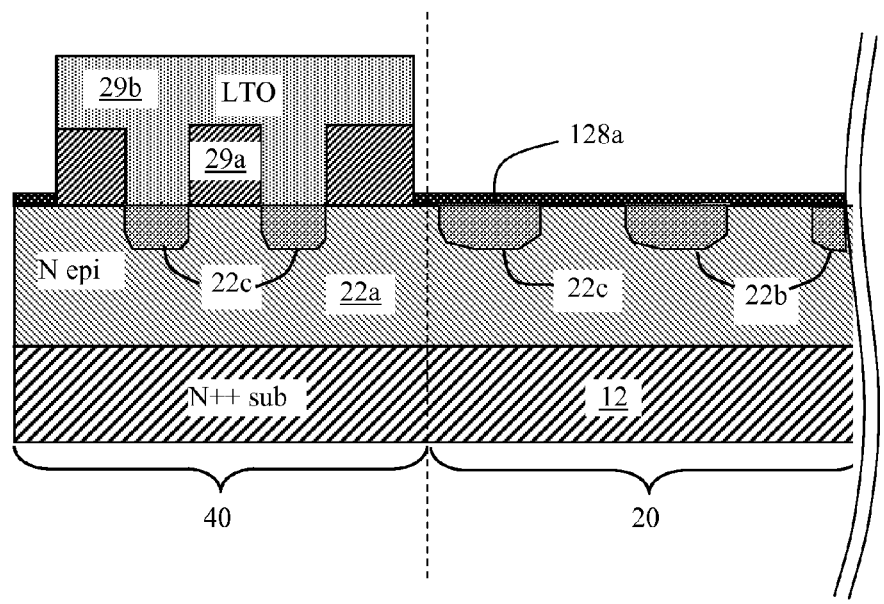
FIG. 1H PRESENT INVENTION

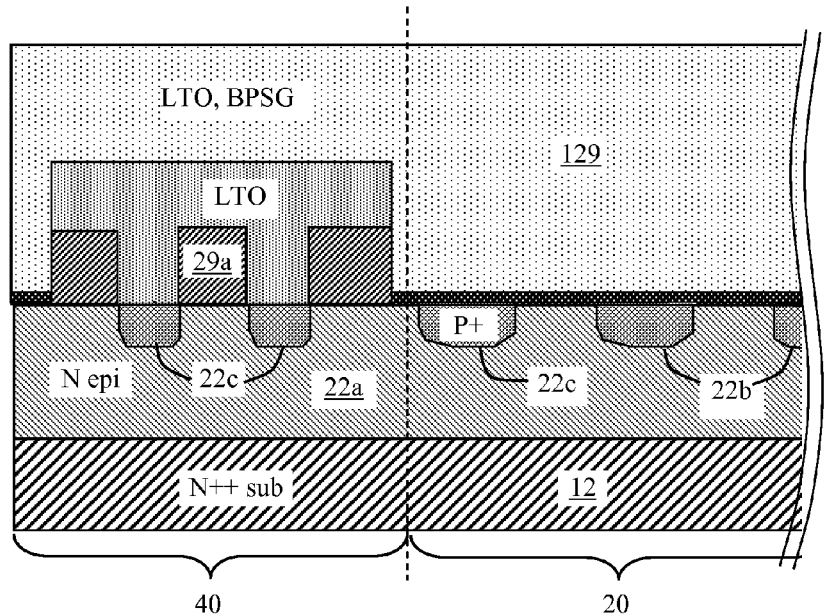
FIG. 1I PRESENT INVENTION
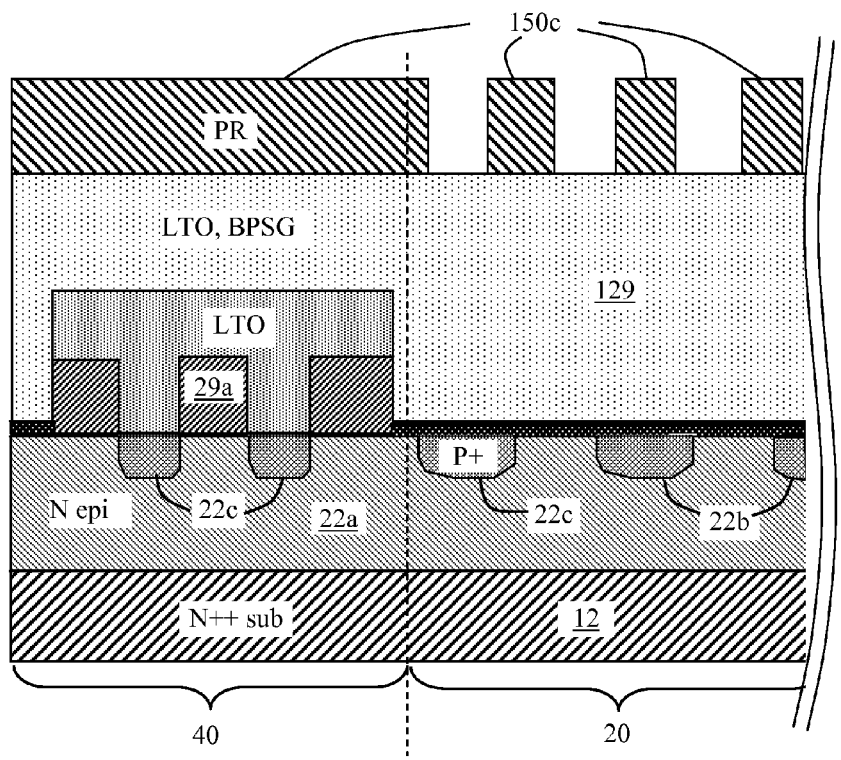
FIG. 1J PRESENT INVENTION

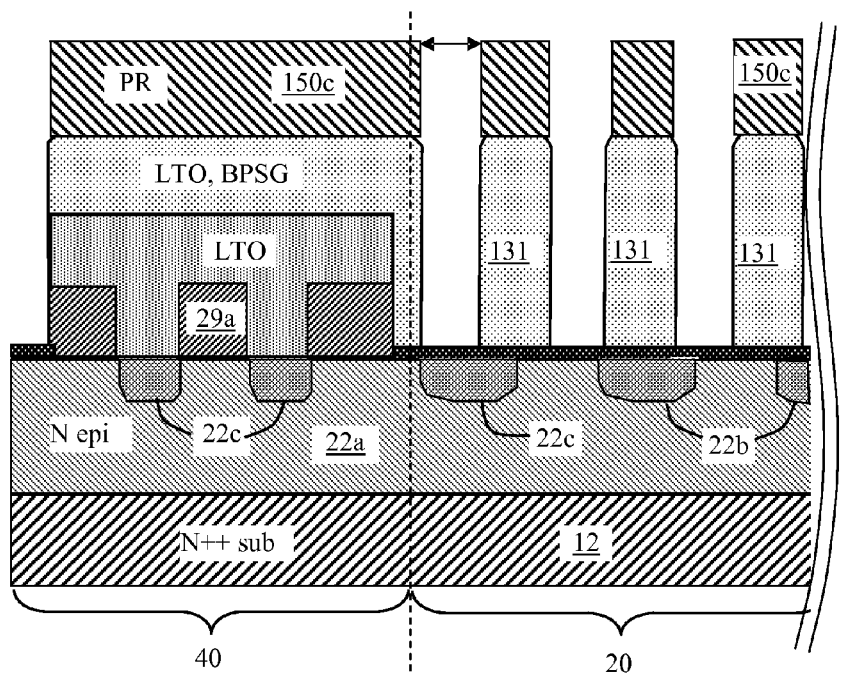
FIG. 1K PRESENT INVENTION
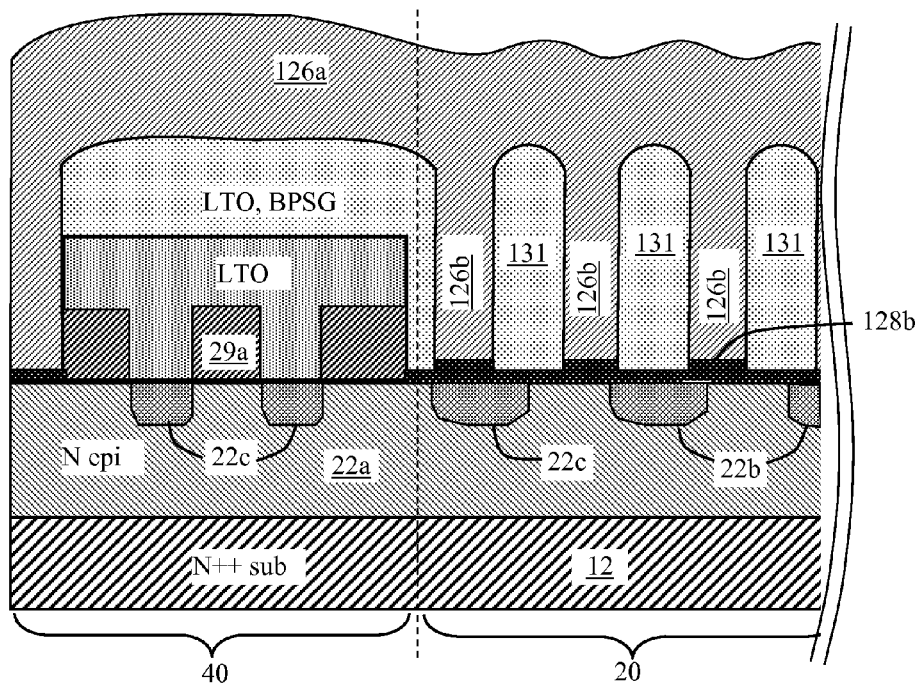
FIG. 1L PRESENT INVENTION

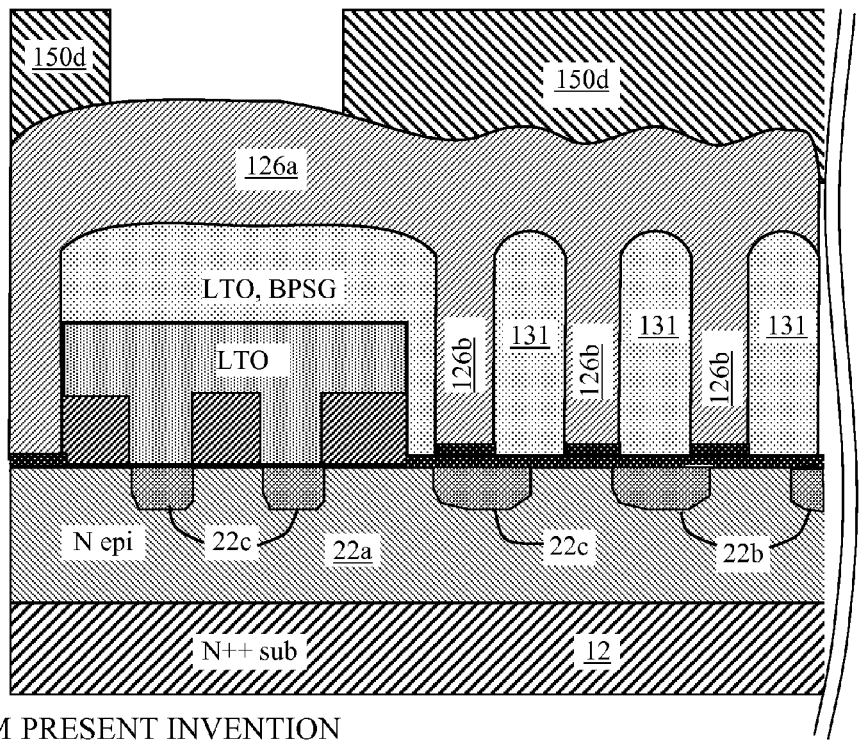
FIG. 1M PRESENT INVENTION
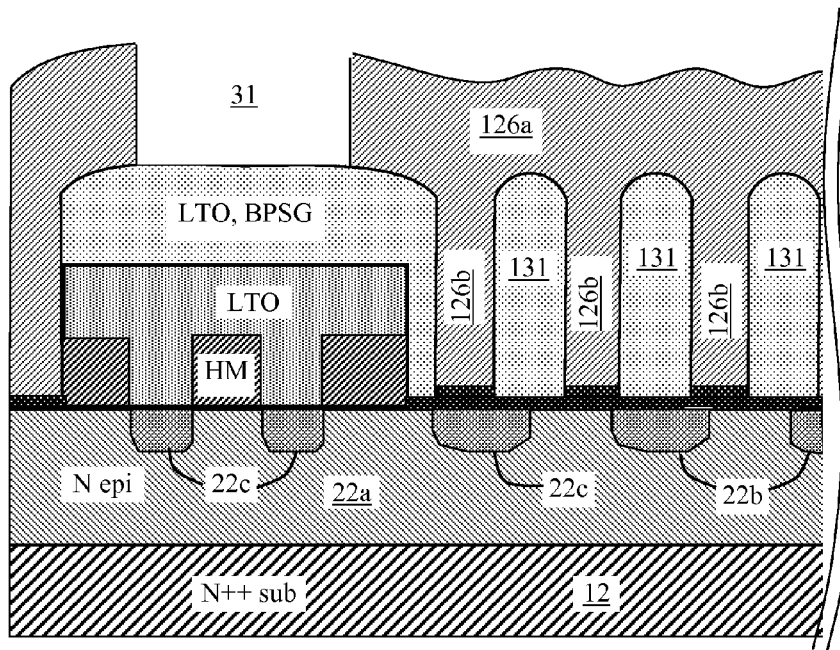
FIG. 1N PRESENT INVENTION

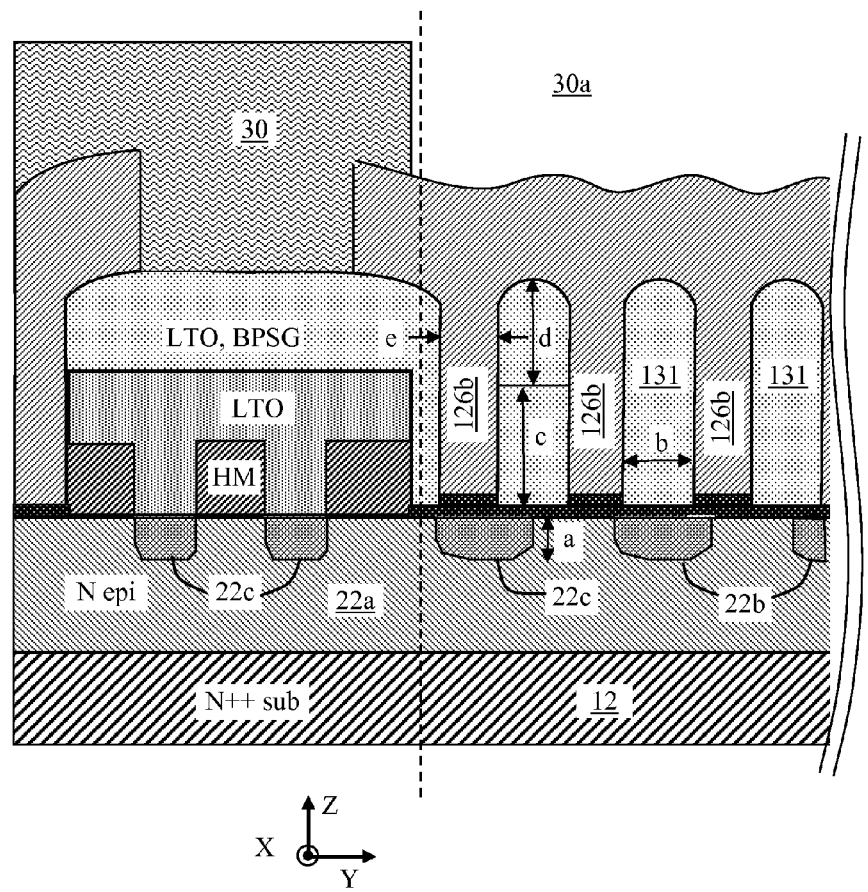
FIG. 10 PRESENT INVENTION

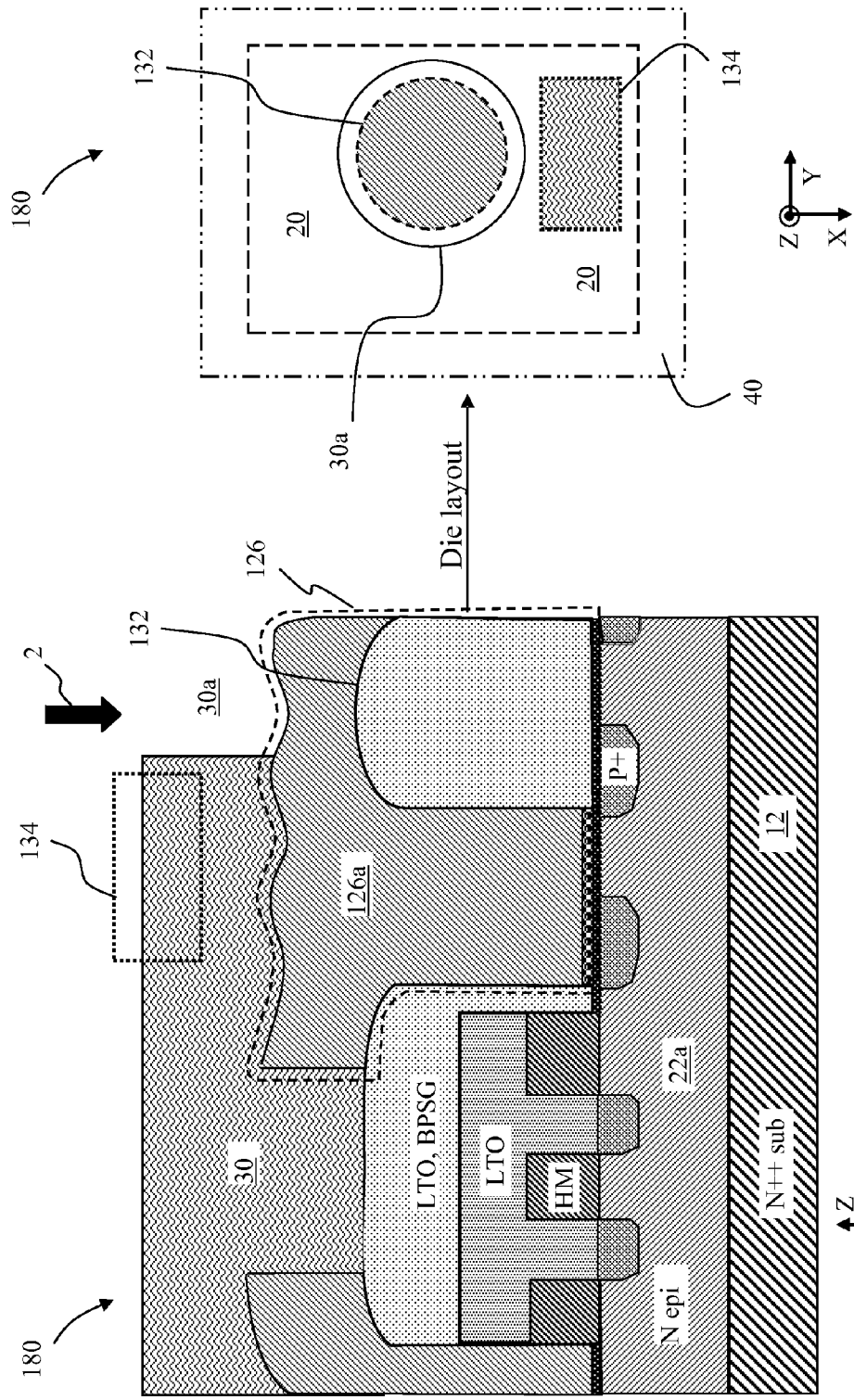
FIG. 2A PRESENT INVENTION
FIG. 2B PRESENT INVENTION

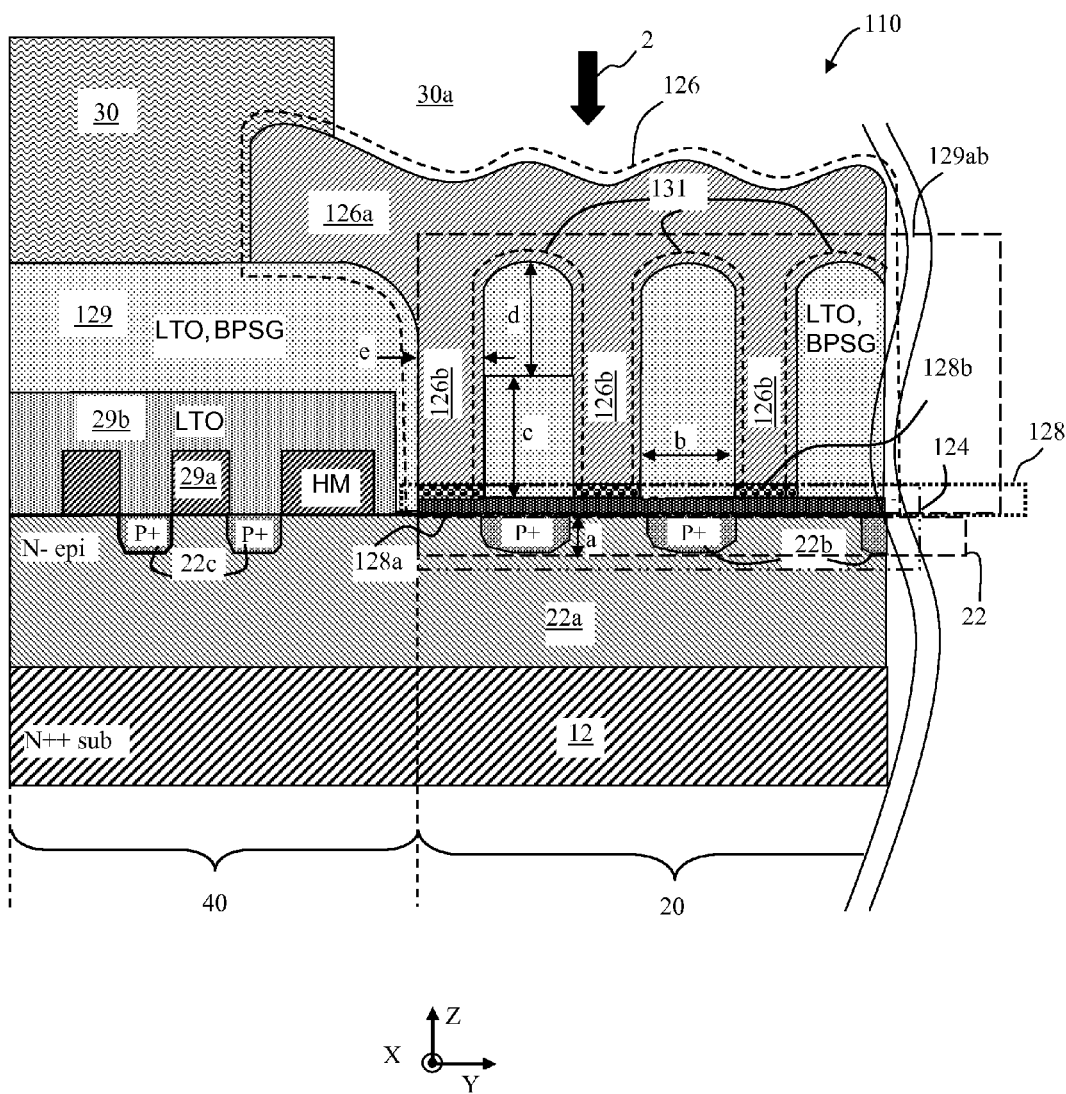
FIG. 4A PRESENT INVENTION

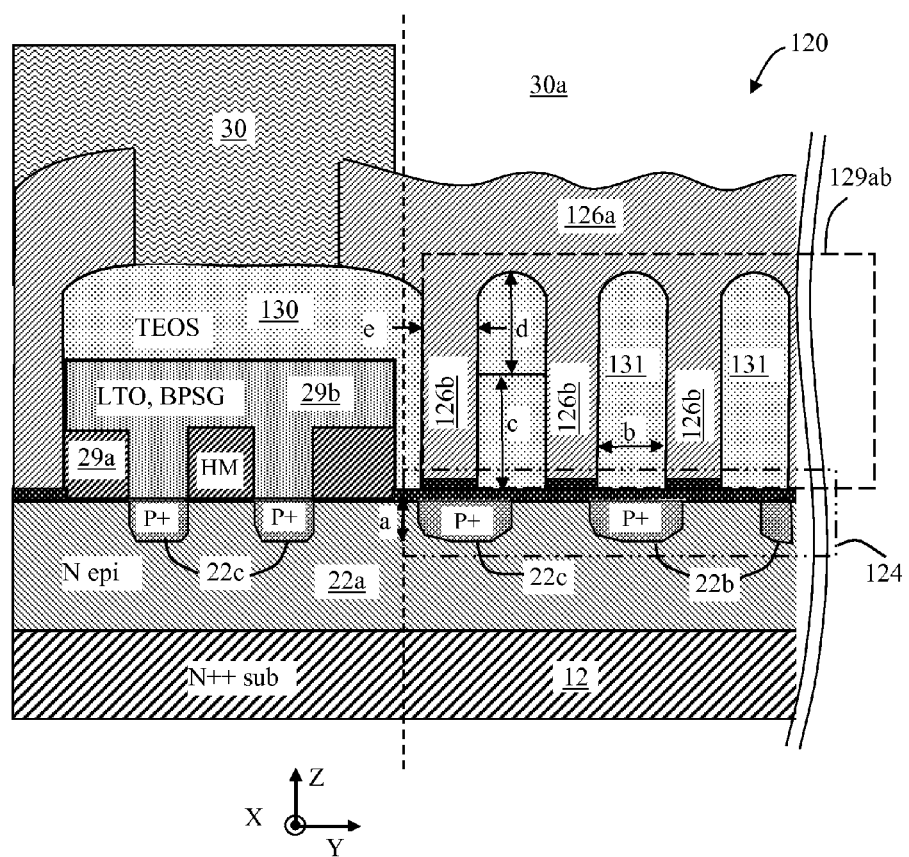
FIG. 4B PRESENT INVENTION

JUNCTION BARRIER SCHOTTKY DIODE WITH ENFORCED UPPER CONTACT STRUCTURE AND METHOD FOR ROBUST PACKAGING

CROSS REFERENCE TO RELATED APPLICATIONS

1. Field of Invention

This invention relates generally to the field of semiconductor device structure. More specifically, the present invention is directed to device structure and associated manufacturing method to form an integrated Junction Barrier Schottky diode with supporting structure for robust post-chip packaging.

BACKGROUND OF THE INVENTION

Schottky diode is a metal-semiconductor junction diode with a highly desirable low forward-voltage drop compared to a semiconductor-semiconductor p-n junction diode. Another important advantage of the Schottky Diode is its low reverse recovery time as it is a "majority carrier" semiconductor device. This means that, for example, if the semiconductor body of the Schottky Diode is doped n-type, only the n-type carriers (mobile electrons) play a significant role in normal operation of the device.

FIG. 3 illustrates an example prior art semiconductor junction barrier Schottky (JBS-SKY) diode 10. Referencing an accompanying X-Y-Z Cartesian coordinate system, the prior art JBS-SKY diode 10 has the following major components:

A semiconductor substrate (SCST) 12 with its major plane lying parallel to the X-Y plane. An active device zone (ACDZ) 20 atop the SCST 12. The ACDZ 20 has a built-in junction barrier Schottky (JBS-SKY) diode 24 with its major device current flowing parallel to the Z-axis.

A peripheral guarding zone (PRGZ) 40 atop the SCST 12. While the right hand of the prior art JBS-SKY diode 10 is not shown here to avoid unnecessary obscuring details, for those skilled in the art it should be understood that the PRGZ 40 is located in an adjacent and surrounding relationship to the ACDZ 20 and the PRGZ 40 is structured for the purpose of maintaining a low leakage current and an increased breakdown voltage of the built-in prior art JBS-SKY diode 10.

The active device zone (ACDZ) 20 has an active lower semiconductor structure (ALSS) 22 and an active upper contact structure (UCS) 26 atop the active ALSS 22 with the juncture between active ALSS 22 and UCS 26 forming the aforementioned junction barrier Schottky (JBS-SKY) diode 24.

As for a more detailed description of these major components, the semiconductor substrate (SCST) 12 is of N++ type conductivity with heavy dopant concentration. The active ALSS 22 has an N-type semiconductor drift layer (SDFL) 22a extended into and through the PRGZ 40 with the top surface portion of ALSS 22 further includes, along an X-Y plane, numerous P+ type surface junction barrier pockets (SJBP) 22b into the SDFL 22a thus forming a junction barrier portion of the JBS-SKY diode 24 with the SDFL 22a. Correspondingly, the PRGZ 40 has numerous peripheral guard rings (PPGR) 22c that, except for being extended into the PRGZ 40 and accordingly patterned, are made of the same material and cross sectioned at the same elevations as the SJBP 22b. The upper part of the PRGZ 40, located just atop the SDFL 22a, has a number of hard mask rings (HMRG) 29a placed in an interdigitated relationship with the PPGR 22c along the X-Y plane. The upper part of the PRGZ 40 also includes a guard ring passivation layer (GRPL) 29b atop and covering the HMRG 29a. In this case, the GRPL 29b is made of low temperature oxide-phosphosilicate (LTO-BPSG) reflow glass.

The prior art UCS 26 has a simple top contact metal (TPCM) 26a. The bottom of UCS 26 includes an intervening barrier metal layer (BRML) 28 between the bottom of TPCM 26a and the top surface of active ALSS 22. The BRML 28 forms, together with a top surface portion of the active ALSS 22, the Schottky diode portion of the built-in JBS-SKY diode 24. Importantly, the BRML 28 also functions as a barrier preventing the TPCM 26a from diffusing into thus poisoning the top surface portion of ALSS 22.

At the top of the prior art JBS-SKY diode 10 is a top device passivation layer (TDPL) 30. The TDPL 30, covering the ACDZ 20 and the PRGZ 40, is patterned with one or more top pad openings (TPO) 30a at pre-determined locations along the X-Y plane, for receiving downward mechanical bonding force 2 during later packaging, for example via wire bonding, of the prior art JBS-SKY diode 10. As a materials example, the TDPL 30 can be made of silicon oxide, silicon nitride or polyimide.

A reliability problem with the prior art JBS-SKY diode 10 is attributable to its post-fabrication packaging. More specifically the bonding force accompanying a wire bonding operation, as illustrated with the downward mechanical bonding force 2, can cause micro cracking of the TPCM 26a at the bottom of the TPO 30a and this in turn allows metal diffusion into thus poisoning the semiconductor material in the top portion of the active ALSS 22, which in turn degrades the original Schottky junction barrier height. The net result is an unacceptably high device leakage current (IDSS) of the packaged prior art JBS-SKY diode 10. In view of this problem, there is a need of improving the prior art JBS-SKY diode 10 for post-packaging reliability.

SUMMARY OF THE INVENTION

A semiconductor junction barrier Schottky (JBS-SKY) diode with enforced upper contact structure (EUCS) is proposed. The JBS-SKY diode includes, referencing an X-Y-Z Cartesian coordinate system, a semiconductor substrate (SCST) with its major plane lying parallel to the X-Y plane, an active device zone (ACDZ) atop the SCST and having a built-in JBS-SKY diode with its major device current flowing parallel to the Z-axis, a peripheral guarding zone (PRGZ) atop the SCST, being located in an adjacent and surrounding relationship to the ACDZ and configured for an increased breakdown voltage of the built-in JBS-SKY diode. The ACDZ includes an active lower semiconductor structure (ALSS) and an enforced active upper contact structure (EUCS) atop the ALSS with the juncture between ALSS and EUCS forming the JBS-SKY diode. The EUCS includes a top contact metal (TPCM) extending downwards and in electrical conduction with bottom of the EUCS and an embedded bottom supporting structure (EBSS) being embedded inside the TPCM and extending downwards till the bottom of the EUCS, which is made of a hard material. Upon encountering a downward mechanical bonding force onto the TPCM during later packaging of the JBS-SKY diode, the EBSS acts to enforce the EUCS against an otherwise potential micro cracking of the TPCM degrading the leakage current of the built-in JBS-SKY diode.

In a more specific embodiment, the JBS-SKY diode further includes an intervening barrier metal layer (BRML) between the bottom of TPCM and the top surface of ALSS. The BRML forms, together with a top surface portion of the ALSS, the Schottky diode portion of the built-in JBS-SKY diode and also functions as a barrier preventing the TPCM from diffusing into thus poisoning the top surface portion of ALSS.

In a more specific embodiment, the hard EBSS material is an insulator and includes a two dimensional grid of separated upward pointing EBSS bumps with the lower portion of TPCM comprising a grid of downward pointing TPCM fingers complementary to and embedding the separated EBSS bumps whereby forming a two dimensional grid contact between the TPCM and a top surface portion of the ALSS throughout the ACDZ.

In a more specific embodiment, BRML is a double layer including a lower barrier metal layer (LBML) extended along an X-Y plane throughout the ACDZ and an upper barrier metal layer (UBML) atop the LBML only extended throughout the X-Y footprints of the TPCM fingers such that double barrier metal layers are only placed beneath the TPCM fingers where they are most needed.

In a more specific embodiment, the hard insulating EBSS material is low temperature thermal oxide-phosphosilicate (LTO-BPSG) reflow glass, or is Tetraethyl orthosilicate (TEOS), and the PRGZ includes a peripheral upper supporting substructure (PUSST) that, except for being extended inside the PRGZ and accordingly patterned, is made of the same material and cross sectioned at the same elevations as the EBSS bumps.

In a more specific embodiment, the EUCS further comprising a top device passivation layer (TDPL), covering the ACDZ and the PRGZ, patterned with one or more top pad openings (TPO) at pre-determined locations along the X-Y plane, for receiving downward mechanical bonding forces during later packaging of the JBS-SKY diode.

In more specific embodiment, the two dimensional grid of separated upward pointing EBSS bumps is geometrically configured such that only a solid EBSS bump top lies below each TPO to better enforce the EUCS against potential TPCM micro cracking.

In more specific embodiment, the grid of EBSS bumps is geometrically configured such that below those areas of the TDPL absent a TPO there is an absence of EBSS bumps as well hence the corresponding volume of EUCS is filled with solid TPCM material to maximize electrical conductance of the EUCS.

In a more particular embodiment, the SCST is of N++ type conductivity with heavy dopant concentration and the ALSS includes a semiconductor drift layer (SDFL), of N type conductivity, extended into and through the PRGZ with the top surface portion of ALSS further comprising, along an X-Y plane, a plurality of surface junction barrier pockets (SJBP) of P+ type conductivity into the SDFL and forming the junction barrier portion of the built-in JBS-SKY diode therewith; and correspondingly, the PRGZ comprising a plurality of peripheral guard rings (PPGR) that, except for being extended into the PRGZ and accordingly patterned, are made of the same material and cross sectioned at the same elevations as the SJBP.

In a more specific embodiment, the lateral dimensions and locations (X-Y plane) of the plurality of SJBP do not have to match those of the grid of upward pointing EBSS bumps.

In more specific embodiment, between the plurality of PPGR and the PUSST, the PRGZ further includes an intervening stack of a plurality of hard mask rings (HMRG) atop yet placed in a spatially interdigitated relationship to the PPGR along an X-Y plane and an LTO layer atop the plurality of HMRG yet beneath the PUSST.

A method of making a semiconductor junction barrier Schottky (JBS-SKY) diode with enforced upper contact structure (EUCS) of the type described above is also proposed. The method includes the following steps:

providing an SCST, partitioning it into an ACDZ and a PRGZ and making a partial JBS-SKY diode atop with a semiconductor drift layer (SDFL), of N type conductivity atop the SCST, having numerous surface junction barrier pockets (SJBP) of P+ type conductivity built into the SDFL thus forming the ALSS therewith and a completed PRGZ with numerous peripheral guard rings PPGR built into the SDFL;

forming a lower barrier metal layer (LBML) atop the ACDZ;

forming the grid of EBSS bumps atop the LMBL;

forming an upper barrier metal layer (UBML) atop the LBML; and depositing and patterning the TPCM.

In a more particular embodiment, the LBML is made of titanium silicide and forming the LBML atop the ACDZ is a two-step self-aligned silicide formation (Salicide) process including the steps of:

depositing titanium (Ti) then titanium nitride (TiN) atop the device in progress; and subjecting the device in progress to a rapid thermal process (RTP) whereby forming, only in the ACDZ, the LBML.

In a more specific embodiment, the grid of EBSS bumps is formed by the following steps:

depositing LTO then BPSG glass atop the device in progress then subjecting it to a thermal reflow process whereby forming an LTO-BPSG reflow glass; or alternatively, just depositing TEOS atop the device in progress;

masking, with an LTO-BPSG glass or TEOS mask, corresponding to X-Y cross section of the grid of EBSS bumps, then anisotropically etching away portions of the LTO-BPSG reflow glass with self termination at the LBML; and removing the LTO-BPSG glass or, alternatively, just removing the TEOS mask whereby forming the grid of EBSS bumps.

In a more specific embodiment, the UBML is made of titanium silicide and forming the UBML atop the LBML is a two-step self-aligned silicide formation (Salicide) process including:

depositing titanium (Ti) then titanium nitride (TiN) atop the device in progress; and subjecting the device in progress to an RTP whereby forming, only in the ACDZ, the UBML.

In a more specific embodiment, depositing and patterning the TPCM includes the following steps:

depositing a TPCM layer atop, then subjecting the device in progress to a heating step for an improved contact between the TPCM layer and the UBML;

with a TPCM mask, masking then patterning the TPCM by etching away portions of unwanted TPCM layer; and removing the TPCM mask.

In a more specific embodiment, making the partial JBS-SKY diode includes the following steps:

making said ALSS and said PPGR plus a plurality of hard mask elements located atop but offset into an interdigitated relationship to the SJBP along the X-Y plane;

depositing a low temperature thermal oxide (LTO) or LTO-BPSG layer onto the device in progress;

with an LTO mask corresponding to the PRGZ, masking then patterning the LTO or LTO-BPSG layer by etching away portions of unwanted LTO or LTO-BPSG layer; and removing the LTO mask whereby completing the PRGZ and the ALSS.

In a more specific embodiment, method of making a JBS-SKY diode further includes the following steps;

depositing and patterning a top device passivation layer (TDPL), covering the ACDZ and the PRGZ, patterned with one or more top pad openings (TPO) at pre-determined locations along the X-Y plane, for receiving downward mechanical bonding forces during later packaging of the JBS-SKY diode.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 4A depicts the present invention semiconductor junction barrier Schottky (JBS-SKY) diode;

FIG. 4B depicts an alternative present invention alternative semiconductor junction barrier Schottky (JBS-SKY) diode;

FIG. 1A through FIG. 1O illustrate the fabrication process flow of the present invention JBS-SKY diode; and FIG. 2A and FIG. 2B respectively illustrate a side cross sectional view and top view of another embodiment of the present invention.

DETAILED DESCRIPTION OF SPECIFIC EMBODIMENTS

Figure 3:
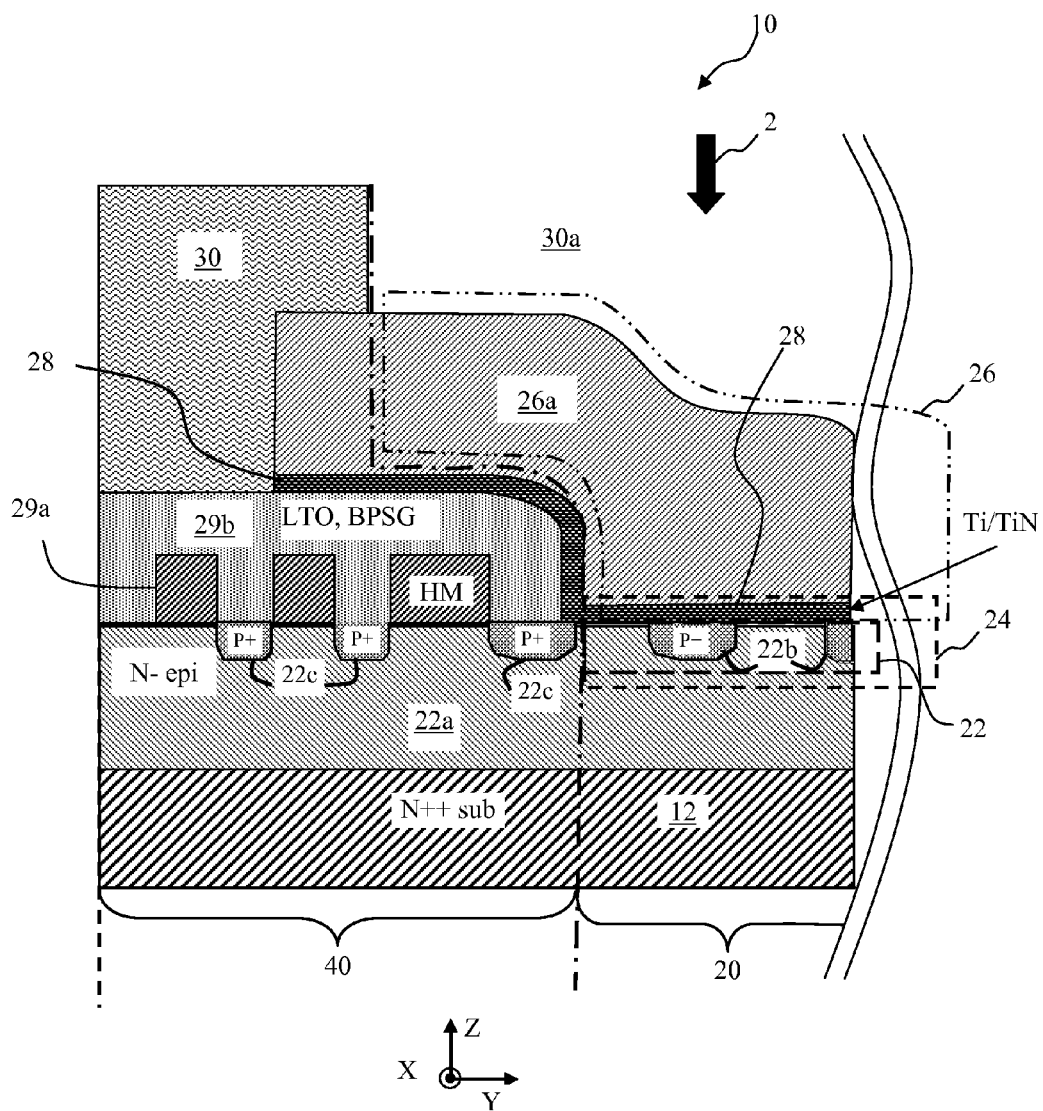
FIG. 3 depicts a prior art semiconductor junction barrier Schottky (JBS-SKY) diode.

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 4A and FIG. 4B illustrate respectively a first version 110 and an alternative version 120 of the present invention semiconductor junction barrier Schottky (JBS-SKY) diode with improved post-packaging reliability. While the SCST 12, PRGZ 40 and ALSS 22 of the present invention JBS-SKY diodes 110 and 120 are respectively structured similar to their corresponding counter parts of the prior art JBS-SKY diode 10, the present invention JBS-SKY diode 110 has an enforced upper contact structure (EUCS) 126 atop the active ALSS 22 with the juncture between active ALSS 22 and EUCS 126 forming a JBS-SKY diode 124. The EUCS 126 is structured quite differently from its counterpart UCS 26 of the prior art JBS-SKY diode 10.

The EUCS 126 has:

A top contact metal (TPCM) 126a extending downwards and in electrical conduction with bottom of the EUCS 126.

An embedded bottom supporting structure (EBSS) 129ab that is embedded inside the TCPM 126a. The EBSS 129ab is made of a hard material and it extends downwards till the bottom of the EUCS 126.

Upon encountering a downward mechanical bonding force 2 inside TPO 30a and onto the TCPM 126a during later packaging of the present invention JBS-SKY diode 110, the EBSS 129ab acts to enforce the EUCS 126 against an otherwise potential micro cracking of the TCPM 126a degrading the leakage current of the built-in JBS-SKY diode 124.

In this illustrated example, the hard EBSS 129ab material is an insulator made of LTO-BPSG reflow glass 129 (FIG. 4A) or TEOS 130 (FIG. 4B). Thus, to insure electrical conduction between the TCPM 126a and the active ALSS 22:

a) The embedded hard EBSS 129ab is configured into, throughout an X-Y area bounded by the ACDZ 20, a two dimensional grid of separated upward pointing EBSS bumps 131.

b) The lower portion of TCPM 126a is configured into a grid of downward pointing TPCM fingers 126b complementary to and embedding the separated EBSS bumps 131.

In this way, a two dimensional electrical grid contact between the TCPM 126a and a top surface portion of the active ALSS 22 is formed throughout the ACDZ 20.

The bottom of EUCS 126 includes an intervening barrier metal layer (BRML) 128 between the bottom of TCPM 126a and the top surface of ALSS 22. The BRML 128 performs similar function as its counterpart BRML 28 in the prior art JBS-SKY diode 10 (FIG. 3). Notice that the BRML 128 is a double barrier metal layer having:

a) A lower barrier metal layer (LBML) 128a extended along an X-Y plane throughout the ACDZ 20.

b) An upper barrier metal layer (UBML) 128b atop the LBML 128a only extended throughout the X-Y footprints of the TPCM fingers 126b.

In this way, the double barrier metal layers are only placed beneath the TPCM fingers 126b where they are most needed. Additionally, full lateral (X-Y plane) areal conduction between the TCPM 126a and the ALSS 22 is maintained throughout the ACDZ 20.

In a particular embodiment of the present invention JBS-SKY diode 110:

The SCST 12 is made of silicon.

The TCPM 126a is made of aluminum-copper (Al—Cu) with thickness in the range of 3 micron-4 micron.

The LBML 128a and the UBML 128b are both made of titanium silicide with thickness in the range of 200 angstrom-1000 angstrom.

The hard insulating EBSS 129ab material is made of low temperature thermal oxide-phosphosilicate (LTO-BPSG) reflow glass 129 (FIG. 4A) or TEOS 130 (FIG. 4B). Correspondingly, the PRGZ 40 has a peripheral upper supporting substructure (PUSST) 129. Except for being extended inside the PRGZ 40 and accordingly patterned, the PUSST 129 is made of the same material and cross sectioned at the same elevations as the EBSS bumps 131.

Similar to the prior art JBS-SKY diode 10, between the numerous PPGR 22c and the PUSST 129 the PRGZ 40 has an intervening stack of:

Numerous HMRG 29a atop yet placed in a spatially interdigitated relationship to the numerous PPGR 22c along an X-Y plane. And:

Either: An LTO guard ring passivation layer GRPL 29b atop the numerous HMRG 29a yet beneath the PUSST 129 made of LTO,BPSG (FIG. 4A).

Or: An LTO,BPSG guard ring passivation layer GRPL 29b atop the numerous HMRG 29a yet beneath the PUSST 130 made of TEOS (FIG. 4B).

In a particular embodiment of the present invention JBS-SKY diode 110, the grid of SJBP 22b is geometrically characterized by:

The depth of SJBP 22b (Z-direction, dimension "a") is from about 0.1 micron to 50 microns.

The grid of EBSS bumps 131 is geometrically characterized by:

A bump cross sectional dimension (X-Y plane, dimension "b") of from about 0.3 micron to about 50 microns.

A bump height (Z-axis, dimension "c+d") of from about 0.3 micron to about 15 microns.

A minimum bump-bump spacing (X-Y plane, dimension "e") of about 1.0 micron.

Another significant embodiment of the present invention is that, while its ALSS 22 is qualitatively structured similar to that of the prior art JBS-SKY diode 10 (FIG. 3), the lateral dimensions and locations (X-Y plane) of the numerous SJBP 22b do not have to match those of the EBSS bumps 131. This is so because full lateral (X-Y plane) areal electrical conduction between the TCPM 126a and the ALSS 22 is maintained by the double barrier metal layer 128 throughout the ACDZ 20. Similar to the prior art JBS-SKY diode 10, the present invention JBS-SKY diode 110 also has a TDPL 30 covering the ACDZ 20 and the PRGZ 40. The TDPL 30 is patterned with one or more TPO 30a at pre-determined locations along the X-Y plane for receiving the downward mechanical bonding force 2 during later packaging of the present invention JBS-SKY diode 110.

In short, whereas the prior art JBS-SKY diode 10 has no LTO-BPSG or TEOS on top of its JBS-SKY diode 24, the present invention adds an embedded hard LTO-BPSG (JBS-SKY diode 110, FIG. 4A) or TEOS (JBS-SKY diode 120, FIG. 4B) grid of bumps over its JBS-SKY diode 124 to prevent reliability problem associated with its post device bonding operation. Otherwise these embedded LTO-BPSG bumps can be randomly placed within the X-Y plane.

FIG. 1A through FIG. 1O illustrate the fabrication process flow of the present invention JBS-SKY diode 110. As a subset of this fabrication process, FIG. 1A to FIG. 1G illustrate the fabrication of a partial JBS-SKY diode without its EUCS 126.

In FIG. 1A an N++ type SCST 12 is provided and an N-type SDFL 22a is epitaxially grown on top of the N++ type SCST 12. A hard mask 29, for example 6000 angstrom in thickness, is then formed upon the device in progress.

In FIG. 1B a photo resist (PR) 150 is coated upon the device in progress.

In FIG. 1C the device in progress is partitioned into an ACDZ 20 and a PRGZ 40 followed by patterning, for example with a wet and dry hard mask etchant through an applied P+ mask, the PR 150 and the hard mask 29 respectively into patterned photo resist (PR) 150a and patterned hard mask 29c.

In FIG. 1D numerous SJBP 22b and PPGR 22c are respectively formed, for example with a BF2 and Boron ion implantation followed by a wet plus dry etch, atop the SDFL 22a in the ACDZ 20 and in the PRGZ 40.

In FIG. 1E the patterned PR 150a are removed followed by the deposition of a GRPL 29b, for example low temperature thermal oxide (LTO) layer (for JBS-SKY diode 110 of FIG. 4A) or thermal oxide-phosphosilicate (LTO-BPSG) layer (for JBS-SKY diode 120 of FIG. 4B), onto the device in progress.

In FIG. 1F, through coating and lithographic patterning a patterned LTO photo resist (PR) mask 150b is created atop the GRPL 29b.

In FIG. 1G the GRPL 29b is patterned by etching away its unwanted portions through the patterned LTO PR mask 150b. It should be recognized that the ALSS 22 and the PPGR 22c are made by now.

In FIG. 1H the patterned LTO PR mask 150b is first removed. A lower barrier metal layer (LBML) 128a made of titanium silicide is then formed atop the active device zone (ACDZ) 20 with a two-step salicide (self-aligned silicide) process with titanium-titanium nitride (Ti—TiN) forming the barrier metal layer. The two-step salicide process entails:

Deposition of Ti onto the device in progress followed by deposition of TiN.

Subjecting the device in progress to a rapid thermal process (RTP) thus forming the LBML 128a only in the active device zone (ACDZ) 20.

Removing excess Ti.

FIG. 1I through FIG. 1K illustrate the formation of the grid of EBSS bumps 131 atop the LBML 128a for the case of fabricating the JBS-SKY diode 110 of FIG. 4A. In FIG. 1I an LTO layer is first deposited followed by the deposition of BPSG atop the device in progress. The device in progress is then subjected to a thermal reflow process thus forming a PUSST 129 made of LTO-BPSG reflow glass. An example of the thermal reflow process is reflow at 900 degree C. for 30 minutes. Alternatively while purposely not shown here to avoid unnecessary obscuring details for those skilled in the art, for the alternative case of fabricating the JBS-SKY diode 120 of FIG. 4B a TEOS layer is deposited atop the devices in progress forming the PUSST 130.

In FIG. 1J the device in progress is masked with a coated then patterned LTO-BPSG photo resist (PR) mask 150c corresponding to X-Y cross section of the intended grid of EBSS bumps 131.

In FIG. 1K the unwanted portions of the LTO-BPSG reflow glass or TEOS is anisotropically etched away with self termination at the LBML 128a, thus forming the grid of EBSS bumps 131 atop the LBML 128a.

In FIG. 1L the patterned LTO-BPSG PR mask 150c is first removed. An UBML 128b is then formed atop the LBML 128a with a two-step salicide (self-aligned silicide) process similar to the one used for the formation of the LBML 128a. A TPCM 126a is deposited atop. The device in progress is then subjected to a heating step for an improved contact between the TPCM 126a and the UBML 128b thus forming the TPCM fingers 126b.

In FIG. 1M a patterned TPCM photo resist (PR) mask 150d is coated and patterned atop the device in progress.

In FIG. 1N the unwanted portions of the TPCM 126a is etched away through the patterned TPCM PR mask 150d revealing a top device passivation window 31. The patterned TPCM PR mask 150d is then removed and this marks the completion of the TPCM 126a.

In FIG. 1O a top device passivation layer is deposited upon the device in progress, masked with a patterned passivation mask then etched to create a top device passivation layer (TDPL) 30 with top pad opening (TPO) 30a thus completing the present invention JBS-SKY diode 110.

FIG. 2A and FIG. 2B respectively illustrate a side cross sectional view and top view of another embodiment of the present invention JBS-SKY diode 180. To better enforce the EUCS 126 against potential micro cracking of the TPCM 126a, the two dimensional grid (distributed in the X-Y plane) of EBSS bumps can be geometrically configured such that only a single solid EBSS bump 132 top lies below each TPO 30a and lines up with the anticipated downward mechanical bonding force 2. Additionally, to maximize electrical conductance of the EUCS 126, the grid of EBSS bumps can be geometrically configured such that below those areas 134 of the TDPL 30 absent a TPO there is an absence of EBSS bumps as well hence the corresponding volume of TPCM 126a is filled with solid TPCM material.

While the description above contains many specificities, these specificities should not be construed as accordingly limiting the scope of the present invention but as merely providing illustrations of numerous presently preferred embodiments of this invention. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A semiconductor junction barrier Schottky (JBS-SKY) diode with enforced upper contact structure (EUCS), the JBS-SKY diode comprising, referencing an X-Y-Z Cartesian coordinate system:
    a semiconductor substrate (SCST) with its major plane lying parallel to the X-Y plane;
    an active device zone (ACDZ) atop the SCST and having a built-in JBS-SKY diode with its major device current flowing parallel to the Z-axis;
    a peripheral guarding zone (PRGZ) atop the SCST and being located in an adjacent and surrounding relationship to the ACDZ, said PRGZ being structured for an increased breakdown voltage of the built-in JBS-SKY diode;
    said ACDZ comprising an active lower semiconductor structure (ALSS) and an enforced active upper contact structure (EUCS) atop the ALSS with the juncture between ALSS and EUCS forming said JBS-SKY diode;
    said EUCS comprising:
        a top contact metal (TPCM) extending downwards and in electrical conduction with bottom of the EUCS; and
        an embedded bottom supporting structure (EBSS), being embedded inside the TPCM and being made of a hard material, said EBSS further extending downwards till the bottom of the EUCS
    such that, upon encountering a downward mechanical bonding force onto the TPCM during later packaging of the JBS-SKY diode, the EBSS acts to enforce the EUCS against an otherwise potential micro cracking of the TPCM degrading the leakage current of the built-in JBS-SKY diode.

2. The JBS-SKY diode with EUCS of claim 1 wherein the bottom of EUCS further comprising an intervening barrier metal layer (BRML) between the bottom of TPCM and the top surface of ALSS, said BRML:
    a) forms, together with a top surface portion of the ALSS, the Schottky diode portion of the built-in JBS-SKY diode; and
    b) also functions as a barrier preventing the TPCM from diffusing into thus poisoning the top surface portion of ALSS.

3. The JBS-SKY diode with EUCS of claim 2 wherein the hard EBSS material is an insulator hence:
    c) the embedded EBSS comprising, throughout an X-Y area bounded by the ACDZ, a two dimensional grid of separated upward pointing EBSS bumps; and
    d) the lower portion of TPCM comprising a grid of downward pointing TPCM fingers complementary to and embedding the separated EBSS bumps
whereby forming a two dimensional grid contact between the TPCM and a top surface portion of the ALSS throughout the ACDZ.

4. The JBS-SKY diode with EUCS of claim 3 wherein the BRML is a double layer comprising:
    e) a lower barrier metal layer (LBML) extended along an X-Y plane throughout the ACDZ; and
    f) an upper barrier metal layer (UBML) atop the LBML only extended throughout the X-Y footprints of the TPCM fingers
such that double barrier metal layers are only placed beneath the TPCM fingers where they are most needed.

5. The JBS-SKY diode with EUCS of claim 4 wherein:
    The SCST is made of silicon;
    The TPCM is made of aluminum-copper (Al—Cu);
    The LBML is made of titanium silicide; and
    the UBML is made of titanium silicide.

6. The JBS-SKY diode with EUCS of claim 3 wherein the hard insulating EBSS material is low temperature thermal oxide-phosphosilicate (LTO-BPSG) reflow glass or Tetraethyl orthosilicate (TEOS); and correspondingly, the PRGZ comprising a peripheral upper supporting substructure (PUSST) that, except for being extended inside the PRGZ and accordingly patterned, is made of the same material and cross sectioned at the same elevations as the EBSS bumps.

7. The JBS-SKY diode with EUCS of claim 3 wherein the grid of EBSS bumps is geometrically characterized by:
    a bump cross sectional dimension (X-Y plane) of from about 0.3 micron to 50 microns;
    a bump height (Z-axis) of from about 0.3 micron to about 15 microns; and
    a minimum bump-bump spacing (X-Y plane) of about 1.4 microns.

8. The JBS-SKY diode with EUCS of claim 3 further comprising a top device passivation layer (TDPL), covering the ACDZ and the PRGZ, patterned with one or more top pad openings (TPO) at pre-determined locations along the X-Y plane, for receiving downward mechanical bonding forces during later packaging of the JBS-SKY diode.

9. The JBS-SKY diode with EUCS of claim 8 wherein, to better enforce the EUCS against potential TPCM micro cracking, the two dimensional grid of separated upward pointing EBSS bumps is geometrically configured such that only a solid EBSS bump top lies below each TPO.

10. The JBS-SKY diode with EUCS of claim 8 wherein, to maximize electrical conductance of the EUCS, the grid of EBSS bumps is geometrically configured such that below those areas of the TDPL absent a TPO there is an absence of EBSS bumps as well hence the corresponding volume of EUCS is filled with solid TPCM material.

11. The JBS-SKY diode with EUCS of claim 8 wherein the TDPL is made of silicon oxide, silicon nitride or polyimide.

12. The JBS-SKY diode with EUCS of claim 4 wherein:
    The SCST is of N++ type conductivity with heavy dopant concentration; and
    the ALSS comprising a semiconductor drift layer (SDFL), of N type conductivity, extended into and through the PRGZ with the top surface portion of ALSS further comprising, along an X-Y plane, a plurality of surface junction barrier pockets (SJBP) of P+ type conductivity into the SDFL and forming the junction barrier portion of the built-in JBS-SKY diode therewith; and correspondingly, the PRGZ comprising a plurality of peripheral guard rings (PPGR) that, except for being extended into the PRGZ and accordingly patterned, are made of the same material and cross sectioned at the same elevations as the SJBP.

13. The JBS-SKY diode with EUCS of claim 12 wherein the lateral dimensions and locations (X-Y plane) of said plurality of SJBP do not have to match those of said grid of upward pointing EBSS bumps.

14. The JBS-SKY diode with EUCS of claim 12 wherein, between the plurality of PPGR and the PUSST, the PRGZ further comprising an intervening stack of:
   a plurality of hard mask rings (HMRG) atop yet placed in a spatially interdigitated relationship to the PPGR along an X-Y plane; and
   an LTO layer atop the plurality of HMRG yet beneath the PUSST.

15. The JBS-SKY diode with EUCS of claim 12 wherein:
   the depth (Z-direction) of SJBP is from about 0.1 micron to 50 microns; and
   the separation (along an X-Y plane) between adjacent SJBPs is from about 0.3 micron to 50 microns.

16. A method of making a semiconductor junction barrier Schottky (JBS-SKY) diode with enforced upper contact structure (EUCS), the JBS-SKY diode comprising, referencing an X-Y-Z Cartesian coordinate system:
   a semiconductor substrate (SCST) parallel to the X-Y plane;
   an active device zone (ACDZ) atop the SCST and having a built-in JBS-SKY diode;
   a peripheral guarding zone (PRGZ) atop the SCST and in adjacent and surrounding relationship to the ACDZ;
   the ACDZ comprising an active lower semiconductor structure (ALSS) and an enforced active upper contact structure (EUCS) atop the ALSS jointly forming the JBS-SKY diode, the EUCS comprising:
      an embedded bottom supporting structure (EBSS) comprising a two dimensional grid of separated upward pointing EBSS bumps made of a hard insulating material; and
      a top contact metal (TPCM) extending downwards with the lower portion of TPCM comprising a grid of downward pointing TPCM fingers complementary to and embedding the separated EBSS bumps such that they act to enforce the EUCS against micro cracking of the TPCM during later packaging of the JBS-SKY diode;
   the method comprising:
      providing an SCST, partitioning it into an ACDZ and a PRGZ and making a partial JBS-SKY diode atop with:
         a semiconductor drift layer (SDFL), of N type conductivity atop the SCST, having numerous surface junction barrier pockets (SJBP) of P+ type conductivity built into the SDFL thus forming the ALSS therewith; and
         a completed PRGZ with numerous peripheral guard rings PPGR built into the SDFL;
      forming a lower barrier metal layer (LBML) atop the ACDZ;
      forming the grid of EBSS bumps atop the LMBL;
      forming an upper barrier metal layer (UBML) atop the LBML; and
      depositing and patterning the TPCM.

17. The method of making a JBS-SKY diode of claim 16 wherein the LBML is made of titanium silicide and forming the LBML atop the ACDZ is a two-step self-aligned silicide formation (Salicide) process comprising:
   depositing titanium (Ti) then titanium nitride (TiN) atop the device in progress; and
   subjecting the device in progress to a rapid thermal process (RTP) whereby forming, only in the ACDZ, the LBML.

18. The method of making a JBS-SKY diode of claim 16 wherein forming the grid of EBSS bumps comprising:
   Depositing LTO then BPSG glass atop the device in progress then subjecting it to a thermal reflow process whereby forming an LTO-BPSG reflow glass;
   masking, with an LTO-BPSG glass mask corresponding to X-Y cross section of the grid of EBSS bumps, then anisotropically etching away portions of the LTO-BPSG reflow glass with self termination at the LBML; and
   removing the LTO-BPSG glass mask whereby forming the grid of EBSS bumps.

19. The method of making a JBS-SKY diode of claim 16 wherein forming the grid of EBSS bumps comprising:
   depositing a layer of Tetraethyl orthosilicate (TEOS) atop the device in progress;
   masking, with a TEOS mask corresponding to the X-Y cross sectional geometry of the grid of EBSS bumps, then anisotropically etching away portions of the TEOS layer with self termination at the LBML; and
   removing the TEOS mask whereby forming the grid of EBSS bumps.

20. The method of making a JBS-SKY diode of claim 16 wherein the UBML is made of titanium silicide and forming the UBML atop the LBML is a two-step self-aligned silicide formation (Salicide) process comprising:
   depositing titanium (Ti) then titanium nitride (TiN) atop the device in progress; and
   subjecting the device in progress to an RTP whereby forming, only in the ACDZ, the UBML.

21. The method of making a JBS-SKY diode of claim 20 wherein depositing and patterning the TPCM comprising:
   depositing a TPCM layer atop, then subjecting the device in progress to a heating step for an improved contact between the TPCM layer and the UBML;
   with a TPCM mask, masking then patterning the TPCM by etching away portions of unwanted TPCM layer; and
   removing the TPCM mask.

22. The method of making a JBS-SKY diode of claim 16 wherein making the partial JBS-SKY diode comprising:
   making said ALSS and said PPGR plus a plurality of hard mask elements located atop but offset into an interdigitated relationship to the SJBP along the X-Y plane;
   depositing a low temperature thermal oxide (LTO) layer onto the device in progress;
   with an LTO mask corresponding to the PRGZ, masking then patterning the LTO by etching away portions of unwanted LTO layer; and
   removing the LTO mask whereby completing the PRGZ and the ALSS.

23. The method of making a JBS-SKY diode of claim 16 further comprising:
   depositing and patterning a top device passivation layer (TDPL), covering the ACDZ and the PRGZ, patterned with one or more top pad openings (TPO) at pre-determined locations along the X-Y plane, for receiving downward mechanical bonding forces during later packaging of the JBS-SKY diode.

* * * * *